(12) United States Patent
Iwabuchi (10) Patent No.: US 7,134,311 B2
(45) Date of Patent: Nov. 14, 2006

(54) DEVICE AND METHOD FOR FABRICATING LEAD FRAME BY PRESS FORMING

(75) Inventor: Masahiro Iwabuchi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 100 days.

(21) Appl. No.: 10/799,601

(22) Filed: Mar. 15, 2004

(65) Prior Publication Data
US 2004/0187551 A1    Sep. 30, 2004

(30) Foreign Application Priority Data
Mar. 27, 2003    (JP)    ............................. 2003-088732

(51) Int. Cl.
*B21F 45/00*    (2006.01)
(52) U.S. Cl. ........................... 72/414; 29/827; 140/105
(58) Field of Classification Search .................. 72/414, 72/412; 29/827, 874; 140/105
See application file for complete search history.

(56) References Cited

U.S. PATENT DOCUMENTS

| 5,226,226 A | * | 7/1993 | Fierkens ...................... 29/827 |
| 5,271,146 A | * | 12/1993 | Kashiwagi .................. 29/566.3 |
| 5,420,752 A | * | 5/1995 | Variot ........................ 361/709 |
| 5,819,579 A | * | 10/1998 | Roberts ........................ 72/412 |
| 5,979,510 A | * | 11/1999 | Hamilton .................... 140/105 |
| 6,357,275 B1 | * | 3/2002 | Ellis et al. ..................... 72/414 |
| 6,401,765 B1 | * | 6/2002 | Carter et al. ................. 140/105 |
| 6,755,069 B1 | * | 6/2004 | Pelletier et al. ............... 72/414 |

FOREIGN PATENT DOCUMENTS

JP    9-027580    1/1997

* cited by examiner

*Primary Examiner*—Daniel C. Crane
(74) *Attorney, Agent, or Firm*—Staas & Halsey LLP (57) ABSTRACT

A device for fabricating a lead frame, by press forming, provided with a die having a flat face, on which a lead frame to be fabricated by press forming is to be placed, and a concavity, which is dented relative to the flat face, the die possessing a fabricating face extending from the bottom of the concavity to the flat face through a slant, which is interposed between the bottom of the concavity and the flat face, the fabricating face contributing the fabrication of a lead frame by press forming, and a punch having punching faces formed so as to be opposite to the fabricating faces of the die for the fabrication of the lead frame by press forming, at least one of the die and the punch being movable so as to hold the lead frame between the fabricating face of the die and the punching face of the punch for the fabrication of the lead frame by press forming, wherein the bottom of the concavity of the die has a bottom concavity formed therein, which is dented relative to the bottom, and the punch has a front end opposite to the bottom of the concavity of the die, the front end being formed so as to have a portion partially spreading over the bottom concavity. A method for fabricating a lead frame by press forming using such a device and a resultant lead frame are also disclosed.

6 Claims, 8 Drawing Sheets

DEVICE AND METHOD FOR FABRICATING LEAD FRAME BY PRESS FORMING

BACKGROUND OF THE INVENTION

1. Field of the Invention

The invention relates to a device and a method for fabricating a lead frame by press forming, and a lead frame fabricated using such a press-forming fabrication device.

2. Description of the Related Art

Figure 3:
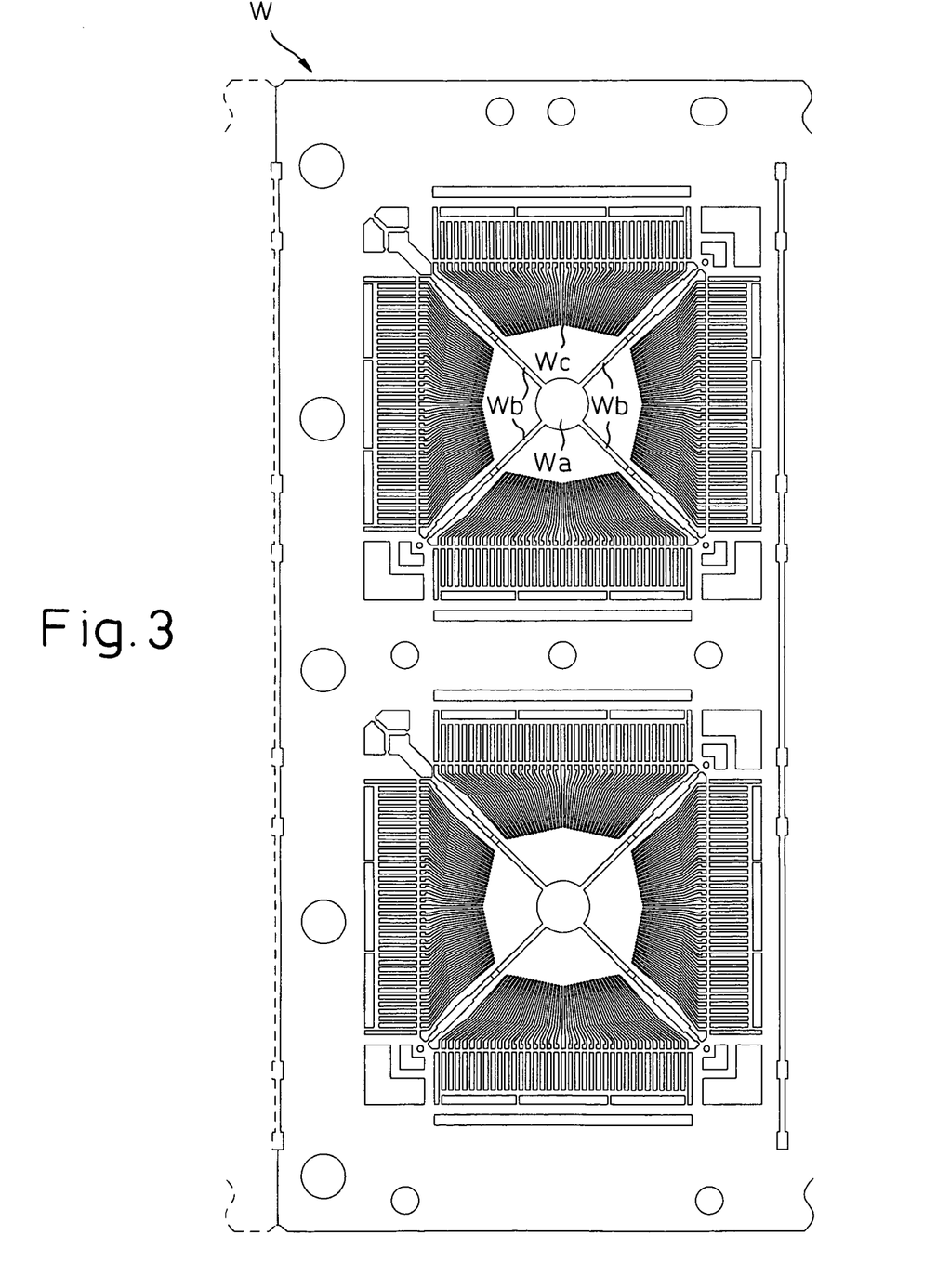
FIG. 3 shows a plan view of lead frames having die-pads, on which a semiconductor chip is to be mounted, and support bars for supporting the die pads.

In a known technique, a lead frame W having a die-pad Wa, on which a semiconductor chip is to be mounted, and inner leads Wc inwardly extending toward the periphery of the die-pad Wa, as shown in FIG. 3, is fabricated by press forming a plurality of support bars Wb connected to the periphery of the die-pad Wa and supporting it, to thereby form a difference in level between the die-pad Wa and the inner lead Wc of the order of the thickness of the semiconductor chip to allow the chip to be stably mounted on the die-pad Wa while decreasing the difference in level and the distances between the external terminals of the semiconductor chip and the inner leads Wc to facilitate the bonding thereof.

A conventional device and method for fabricating a lead frame by press forming is described in Japanese Unexamined Patent Publication (Kokai) No. 9-27580 (JP 9-27580 A). The device described in this document performs the press forming of a lead frame W by holding the lead frame W between a die 2 and a punch 6 and forming the lead frame W to provide it with a shape along the die 2 and the punch 6, as seen from FIG. 1 of the document.

In the conventional device for fabricating a lead frame by press forming as described in JP 9-27580 A, there are problems such that the bent portions of the fabricated lead frame revert (a phenomenon of so-called spring-back), and the depth and the angle of the bending are uneven, leading to increased variation in fabricated shapes of products (lead frames).

Figure 8:
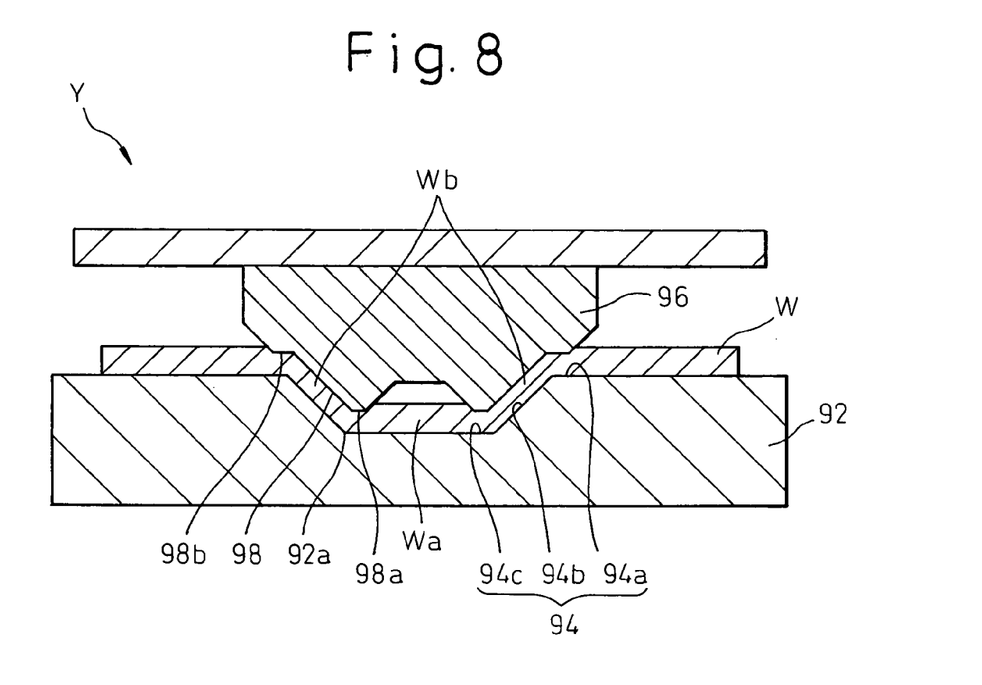
FIG. 8 is a longitudinal section of a conventional device for fabricating a lead frame by press forming.
Figure 9:
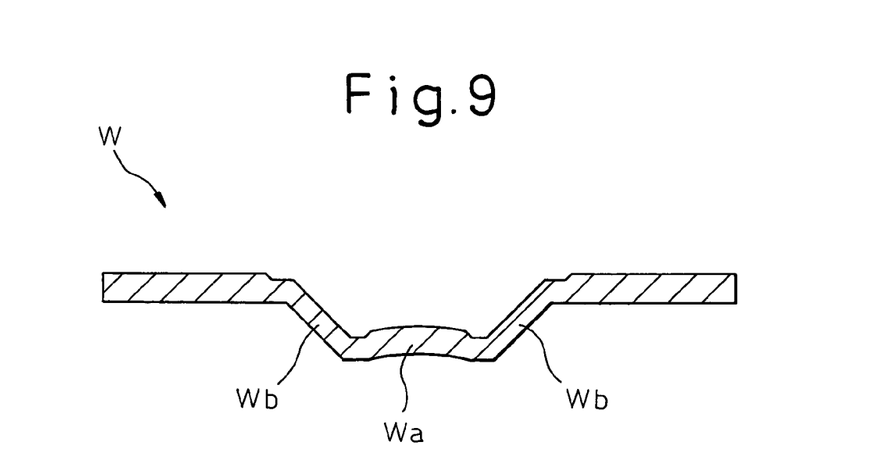
FIG. 9 is a longitudinal section of a lead frame fabricated by press forming using a conventional device.

To solve the problems, Shinko Electric Industries Co., Ltd., Nagano, Japan has developed a device Y for fabricating a lead frame by press forming, as illustrated in FIG. 8. The device Y is provided with a die 92 having a flat face 94a, on which a lead frame to be fabricated by press forming is placed, and a concavity 92a, which is dented relative to the flat face 94a, the concavity having a fabricating face 94 extending from the bottom 94c of the concavity 92a to the flat face 94a through a slant 94b, which is interposed between the bottom 94c and the flat face 94a, and the fabricating face 94 contributing the fabrication of a lead frame. The device Y is also provided with a punch 96, which can be relatively moved toward the die 92 and which has punching faces 98 formed so as to be opposite to the fabricating faces 94 of the die 92. The concavity 92a is formed such that when a lead frame W is placed on the flat face 94a, the die-pad Wa thereof is located over the concavity 92a and the respective support bars Wb straddle the margins of the concavity 92a. The fabricating faces 94 are formed at the locations of the concavity 92a which the support bars Wb straddle.

The device Y for fabricating a lead frame by press forming can fabricate the respective support bars Wb of the lead frame W by holding the support bars Wb between the fabricating faces 94 of the die 92 and the punching faces 98 of the punch 96 when the punch 96 is come close to the die 92.

In the device Y, the front ends 98a of the punch 96 opposite to the bottom 94c of the concavity 92a have an area smaller than the area of the bottom 94c of the concavity 92a, and somewhat squash the vicinities of the inner sides of the bent portions of the lead frame W (the support bars Wb), which are located between the front ends 98a of the punch 96 and the bottom 94c of the concavity 92a, during the fabrication by press forming. The shoulders 98b of the punching faces 98 opposite to the flat face 94a of the die 92 somewhat squash the vicinities of the outer sides of the bent portions of the lead frame W (the support bars Wb), which are located between the shoulders 98b of the punching faces 98 and the flat face 94a of the die 92, during the fabrication by press forming.

In the case of the use of the device Y for fabricating a lead frame W by press forming in FIG. 8, squashing the vicinities of the bent portions of the lead frame W by press-forming fabrication can prevent the spring-back of the fabricated lead frame W, and can render the depth and the angle of the bending even, resulting in the reduced variation in fabricated shapes of products (lead frames).

However, there is still a problem that the lead frame W having diagonally opposite support bars Wb, which has been press-formed by the conventional device described in JP 9-27580 A or the device Y of FIG. 8, is curved such that the intermediate section between the bent portions opposite to each other, including parts of the support bars Wb and the die pad Wa, is warped up at the side thereof having been in contact with the punch 96 during the fabrication.

Particularly recent miniaturization and increased integration of semiconductor devices has led to the increased demand for the formation of lead frames having very small thicknesses, such as 0.15 millimeter or smaller. The smaller the thickness of a lead frame, the larger the curvature of the lead frame. On the other hand, standards of planarity of a lead frame tend to be severe year by year. For example, a standard specifying a displacement of a die-pad and support bars by curvature of 0.015 millimeter or smaller has been established. However, there is a problem that conventional devicees for fabricating a lead frame by press forming cannot satisfy such a standard in some cases.

SUMMARY OF THE INVENTION

To solve the above problems, the invention aims to provide a device and a method for fabricating a lead frame by press forming, which can prevent the spring-back of a lead frame fabricated by press forming, and can render the depth and the angle of the bending even, resulting in the reduced variation in shapes of fabricated products (lead frames), and which can simultaneously inhibit the curvature or distortion of the lead frame fabricated by press forming, and also to provide a lead frame obtained by the device and the method for fabricating a lead frame by press forming.

The inventor has vigorously considered the causes of the curvature of a lead frame, and has achieved the invention by surmising them as follows.

Figure 10:
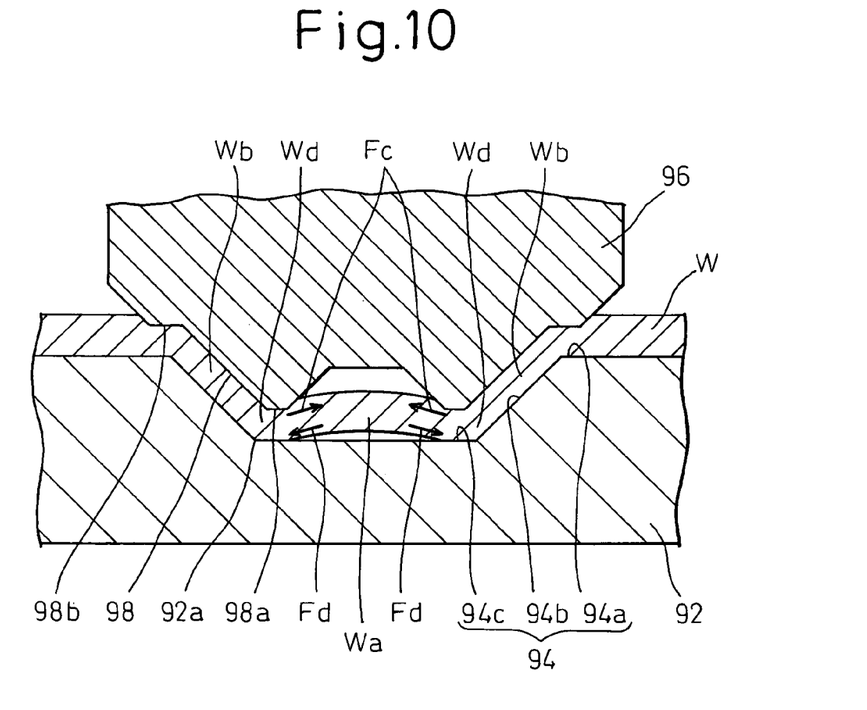
FIG. 10 illustrates the fabrication of a lead frame by press forming using a conventional device.

As shown in FIG. 10, when diagonally opposite support bars Wb of a lead frame W are press-formed between a die 92 and a punch 96, the material at the inner side of bent portion Wd of the lead frame W becomes excessive due to the bending and the squashing by the front end 98a of the punch 96, and is expelled toward the opposite bent portion Wd, as shown by arrow Fc in the drawing. On the other hand, the outer side of the bent portion Wd of the lead frame W is drawn due to the bending, and tends to drag to the bent portion Wd the material between the opposite bent portions Wd, as shown by arrow Fd. The inventor has surmised that as a result, between the opposite bent portions Wd of the lead frame W, the material of the lead frame is excessive at the side facing the punch 96 (the upper side), and the material is short at the side facing the die 92 (the lower side); consequently, the lead frame W is upwardly curved between the opposite bent portions Wd so that the lead frame W has a larger diameter at the side facing the punch 96.

Accordingly, the device for fabricating a lead frame by press forming of the invention is a device provided with a die having a flat face, on which a lead frame to be fabricated by press forming is to be placed, and a concavity, which is dented relative to the flat face, the die possessing a fabricating face extending from the bottom face of the concavity to the flat face at a slant, which is interposed between the bottom face of the concavity and the flat face, the fabricating face contributing to the fabrication of a lead frame by press forming, and a punch having punching faces formed so as to be opposite to the fabricating faces of the die for the fabrication of the lead frame by press forming, at least one of the die and the punch being movable so as to hold the lead frame between the fabricating face of the die and the punching face of the punch for the fabrication of the lead frame by press forming, wherein the bottom face of the concavity of the die has a bottom concavity formed therein, which is dented relative to the bottom face, and the punch has a front end opposite to the bottom face of the concavity of the die, the front end being formed so as to have a portion partially spreading over the bottom concavity.

In an embodiment of the device of the invention, a lead frame having a die-pad, on which a semiconductor chip is to be mounted, and support bars for supporting the die-pad, are fabricated by press forming. In this case, the concavity of the die is formed such that the die-pad of the lead frame is located over the concavity and the respective support bars of the lead frame straddle the margins of the concavity when the lead frame is placed on the flat face of the die, whereby the support bars of the lead frame are held between the fabricating face of the die and the punching face of the punch.

According to the invention, a lead frame is fabricated by press forming by a method which uses a device comprising a die having a flat face, on which a lead frame to be fabricated by press forming is to be placed, and a concavity, which is dented relative to the flat face, the die possessing a fabricating face extending from the bottom face of the concavity to the flat face through a slant, which is interposed between the bottom face of the concavity and the flat face, the fabricating face contributing the fabrication of a lead frame by press forming, and a punch having punching faces formed so as to be opposite to the fabricating faces of the die for the fabrication of the lead frame by press forming, at least one of the die and the punch being movable so as to hold the lead frame between the fabricating face of the die and the punching face of the punch for the fabrication of the lead frame by press forming, the method using, as the device for the fabrication by press forming, a device comprising a die having a concavity, the bottom face of which has a bottom concavity formed therein, which is dented relative to the bottom face, and a punch having a front end opposite to the bottom face of the concavity of the die, the front end being formed so as to have a portion partially spreading over the bottom concavity.

When the method of the invention is used to fabricate a lead frame having a die-pad by press forming, on which a semiconductor chip is to be mounted, and support bars for supporting the die-pad, the concavity of the die of the device used is formed such that the die-pad of the lead frame is located over the concavity and the respective support bars of the lead frame straddle the margins of the concavity when the lead frame is placed on the flat face of the die, whereby the support bars of the lead frame is hold between the fabricating face of the die and the punching face of the punch.

According to the invention, during the fabrication by press forming, a portion of a lead frame held between the bottom of the concavity of the die and the front end of the punch is squashed at the side in contact with the bottom of the concavity of the die. Consequently, it is believed that the material of a bent portion of the lead frame fabricated by press forming along the slant and the bottom of the concavity of the die becomes excessive at the outer side and, thus, the force of dragging the material between opposite bent portions to the respective bent portions becomes small, resulting in the suppressed curvature of the lead frame. By making the difference in pressure (displacement of material) between the inner and the outer sides of the bent portion of a lead frame small, the distortion around the bent portion of the lead frame can be suppressed not only when a lead frame is fabricated by press forming at the opposite locations of the lead frame (for example, diagonally opposite support bars) to have a concavity, but also when a lead frame having a free end is fabricated by press forming to provide a lead frame with bent cantilevered members.

According to the invention, there is also provided a lead frame fabricated by press forming and having an upper bent portion and a lower bent portion as a result of the fabrication by press forming, wherein the lead frame has a squashed part having a reduced thickness on the lower side of the lower bent portion at or in the vicinity of the lower bent portion.

In an embodiment, the lead frame of the invention has a die-pad, on which a semiconductor chip is to be mounted, and support bars for supporting the die-pad, and wherein each of the support bars has the squashed part.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein.

DETAILED DESCRIPTION OF THE INVENTION

Figure 1:
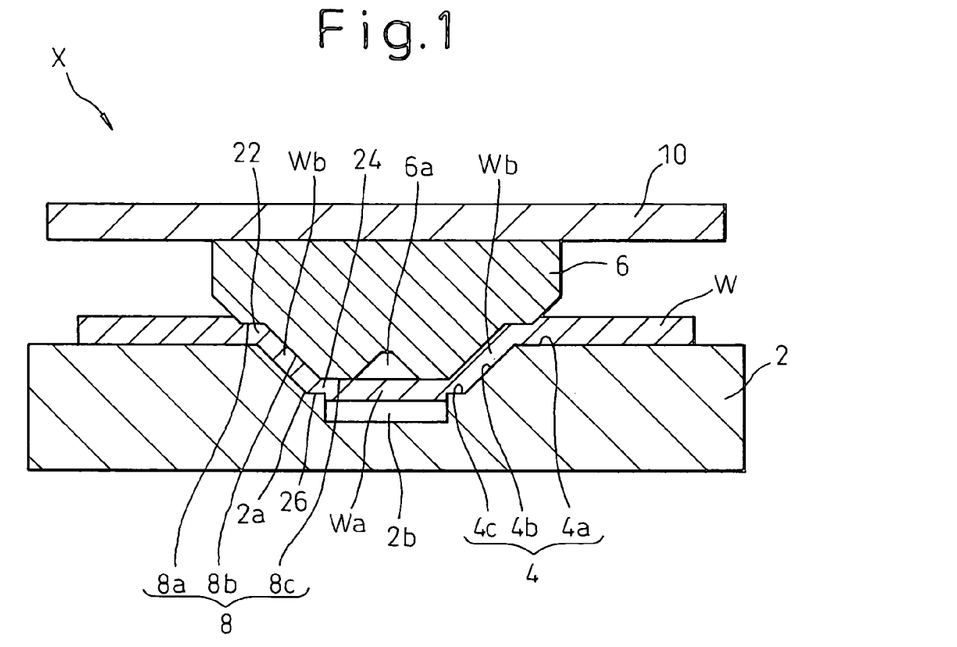
FIG. 1 is a longitudinal section of a device for fabricating a lead frame by press forming of the invention.

FIG. 1 schematically shows a longitudinal section of a device X for fabricating a lead frame by press forming of an embodiment of the invention.

The device X depicted in FIG. 1 is provided with a die 2 and a punch 6 for the fabrication of a lead frame by press forming, with at least one of the die 2 and the punch 6 being movable so as to hold therebetween the lead frame to be fabricated.

The die 2 has a flat face 4a, on which a lead frame to be fabricated by press forming is to be placed, and a concavity 2a, which is dented relative to the flat face 4a, the die possessing a fabricating face 4 extending from the bottom 4c of the concavity 2a to the flat face 4a through a slant 4b, which is interposed between the bottom 4c and the flat face 4a, and the fabricating face 4 contributing to the fabrication of a lead frame by press forming.

The concavity 2a of the die 2 is formed such that when a lead frame W is placed on the flat face 4a, the die-pad Wa of the lead frame W is located over the concavity 2a and the respective support bars Wb of the lead frame W straddle the margins of the concavity 2a. The fabricating faces 4 of the die 2 are formed at the locations which the support bars Wb straddle.

In addition, the bottom 4c of the concavity 2a of the die 2 of the invention has a bottom concavity 2b formed therein, which is further dented relative to the bottom 4c which is in turn dented relative to the flat face 4a.

The punch 6 of the device X of the invention has punching faces 8 formed so as to be opposite to the fabricating faces 4 of the die 2 for the fabrication of a lead frame by press forming. The punching face 8 of the punch 6 is formed from the front end 8c of the punch 6 opposite to the bottom 4c of the concavity 2a of the die 2, the slant 8b opposite to the slant 4b of the concavity 2a, and the shoulder 8a opposite to the flat face 4a of the die 2. The punch 6 is fixed to a support member 10, which is provided so as to be capable of being moved toward and apart from the die 2 by a driving means not shown.

It is sufficient for the die 2 and the punch 6 to be relatively displaced. For example, the die 2 may be moved toward and apart from the punch 6, or both die 2 and punch 6 may be mutually moved.

The front end 8c of the punch 6 opposite to the bottom 4c of the concavity 2a of the die 2 is formed so as to have a portion extending in the direction toward the center of the bottom concavity 2b of the die 2 and partially spreading over the bottom concavity 2b. In other words, the front end 8c of the punch 6 opposite to the bottom 4c of the concavity 2a of the die 2 is formed to have a width in the direction from the lower end of the slant 8b of the punch 6 toward the center of the concavity 2a of the die 2 (i.e., the longitudinal direction of the support bar Wb of the lead frame W to be fabricated by press forming), which is larger than the width from the edge of the bottom 4c of the concavity 2a connecting to the slant 4b of the die 2 to the edge of the bottom concavity 2b.

Using the device X of the invention, a lead frame W having an upper bent portion 22 and a lower bent portion 24 as a result of the fabrication by press forming is obtained, the lead frame W having a squashed part 26 having a reduced thickness on the lower side (outer side) of the lower bent portion 24 at or in the vicinity of the lower bent portion.

In the device X for fabricating a lead frame by press forming of the present embodiment, a void 6a may be provided between the opposite front ends 8c of the punch 6 for subjecting the support bars Wb of the lead frame W to the fabrication, so that the punch 6 is not in contact with the lead frame to be fabricated in the vicinity of the center of the bottom concavity 2b of the die 2. This is advantageous because a possibility of the center of the die-pad Wa of the lead frame W, on which a semiconductor chip is to be mounted, being damaged by coming into contact with the punch 6 during the fabrication of the lead frame W, can be avoided. In some cases, the punch 6 may have a continuous front end without the voids 6a.

The device X according to the invention fabricates the lead frame W, by press forming, by moving the punch 6 fixed to the support member 10 driven by the driving means close to the die 2, and holding the lead frame W between the fabricating face 4 of the die 2 and the punching face 8 of the punch 6.

The device X according to the invention is also provided with a lower stopper means, which is not shown in the drawing, so as to bring the support member 10 to a stop to thereby prevent the lead frame W from being excessively squashed or being penetrated by the punch 6, or to prevent the die 2 or the punch 6 from being damaged, due to excessive pressure between the die 2 and punch 6 when the driving means moves the punch 6 toward the die 2 for the fabrication of the lead frame W by press forming between the fabricating faces 4 of the die 2 and the punching faces 8 of the punch 6 and the die 2 and the punch 6 are too close to each other.

When the lead frame W is fabricated by press forming using the device X according to the invention, the lead frame to be fabricated by press forming is placed on the flat face 4a of the die 2 in such a manner that in the condition that punch 6 is far from the die 2, the die-pad Wa of the lead frame W is located above the concavity 2a of the die 2 and the support bars Wb of the lead frame W straddle the margins of the concavity 2a. Subsequently, the support member 10 is moved by the driving means in the direction that it approaches the die 2, to thereby approximate the punch 6 to the die 2 and hold the support bars Wb of the lead frame W between the fabricating face 4 of the die 2 and the punching face 8 of the punch 6 for the fabrication by press forming. At this time, the lower stopper means brings the support member 10 to a stop at a predetermined lowermost position.

Figure 2:
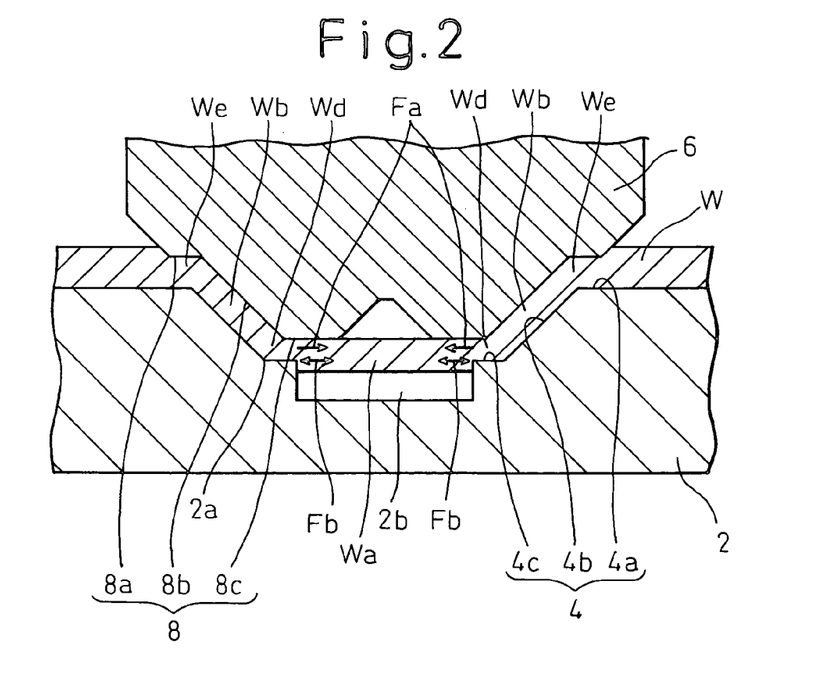
FIG. 2 illustrates the fabrication of a lead frame by press forming using the device of the invention.

In the device X for fabricating a lead frame by press forming of the invention, the front end 8c of the punch 6 has a portion extending in the direction toward the center of the bottom concavity 2b of the die 2 and partially spreading over the bottom concavity 2b (in other words, the front end 8c of the punch 6 is formed to have a width in the direction from the lower end of the slant 8b of the punch 6 toward the center of the concavity 2a of the die 2, which is larger than the width from the edge of the bottom 4c of the concavity 2a connecting to the slant 4b of the die 2 to the edge of the bottom concavity 2b). Accordingly, when the support bar Wb of the lead frame to be fabricated by press forming is held between the fabricating face 4 of the die 2 and the punching face 8 of the punch 6, the portion of the support bar Wb in contact with the front end 8c of the punch 6 has an area larger than the area of the portion of the support bar Wb in contact with the bottom 4c of the concavity 2a of the die 2. As a result, the portion of the lead frame W held between the bottom 4c of the die 2 and the front end 8c of the punch 6 receives a larger pressure at the side in contact with the die 2 rather than the side in contact with the punch 6, and, at the bent portion Wd of the lead frame W, at which the support bar Wb of the lead frame W is bent from the orientation along the slant 4b of the die 2 to the orientation along the bottom 4c, a squashed part is created at the outer side (lower side) of the bent portion Wd in contact with the bottom 4c of the die 2, as shown in FIG. 2.

Also, at the portion of the support bar Wb of the lead frame W held between the flat face 4a of the die 2 and the shoulder 8a of the punch 6, the shoulder 8 intrudes into the support bar Wb of the lead frame W, and, at the bent portion We of the lead frame W, at which the support bar Wb is bent from the orientation along the flat face 4a of the die 2 to the orientation along the slant 4b, a squashed part is created at the outer side of the bent portion We in contact with the shoulder 8a of the punch 6.

Using the device X for fabricating a lead frame by press forming of the invention, the spring-back of the lead frame W fabricated by press forming can be prevent, and the depth and the angle of the bending can be made even, resulting in the reduced variation in shapes of fabricated products (lead frames), by creating the squashed parts at or in vicinity of the bent portions Wd, We of the lead frame W.

Further, the inventor has experimentally confirmed that by fabricating a lead frame by press forming using the device X of the invention, the curvature conventionally occurred between the bent portions of the fabricated lead frame, which represent the bent portions Wd and We of the lead frame W depicted in FIG. 2, can be very small (specific measured values of displacement of curvature will be shown later).

Although the inventor has not fully elucidated the reason why the curvature between the bent portions Wd and We of the lead frame W can be restrained, and by what mechanism, using the device X of the invention, it is surmised that the balance of the forces acting at the outer side and the inner side of the bent portion Wd (the displacement of material) contributes it.

According to the fabrication of a lead frame by press forming using the device X of the embodiment of the invention, the material at the inner side of the bent portion Wd of the lead frame W becomes excessive by the bending, to be thereby displaced or expelled toward the opposite bent portion Wd (inwardly), as shown by the arrow Fa in FIG. 2. As the lead frame W is hardly squashed by the front end 8c of the punch 6, the amount of displacement of the material is small compared to the amount of displacement of the material (the arrow Fc in FIG. 10) occurred at the inner side of the bent portion Wd of the fabricated lead frame W as shown in FIG. 10. On the other hand, at the outer side of the bent portion Wd of the lead frame W fabricated by press forming using the device X of the embodiment of the invention, the force of drawing the material between the opposite bent portions Wd toward the respective bent portions Wd due to the tension by the bending is cancelled out by the force of expelling the material toward the opposite bent portion Wd by the squashing (the arrow Fb in FIG. 2).

Consequently, it is believed that the fabrication of a lead frame by press forming using the device of the embodiment of the invention can make the difference in amount of the displacements of material in the opposed directions at the inner and the outer sides of the bent portion Wd very small, resulting in the suppression of the curvature of the lead frame W, in comparison with the displacements of material at the inner and the outer sides of the bent portion of the conventional lead frame toward the opposed directions Fc, Fd (FIG. 10) causing the lead frame to be curved.

Experiments were carried out to measure the amount of curvature of the lead frame fabricated by press forming using the device X of the invention and the amount of curvature of the lead frame fabricated by press forming using the conventional device Y shown in FIG. 8.

Figure 4:
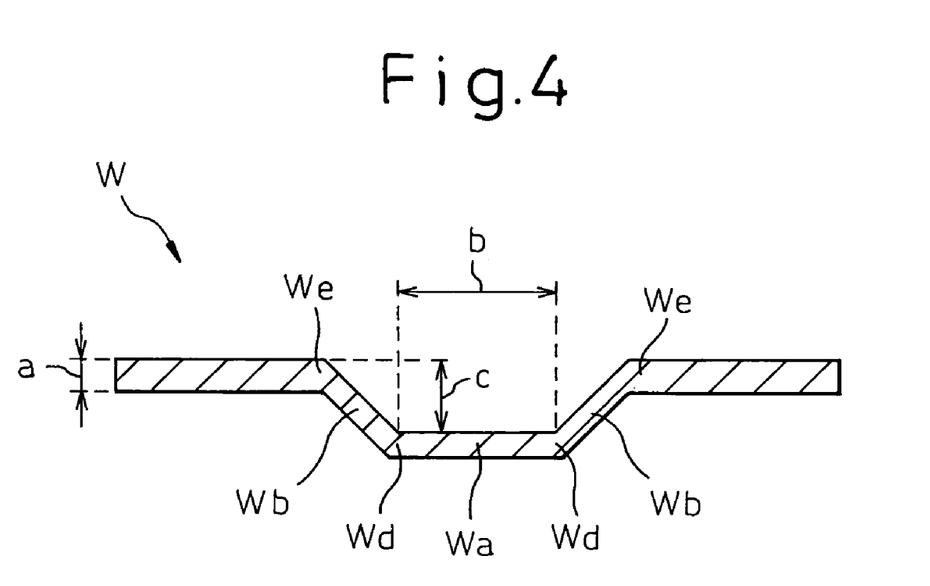
FIG. 4 is an illustration of the lead frame used in an experiment of the fabrication by press forming.

For the experiments, lead frames W made of a copper material having a thickness a of 0.150 millimeter and illustrated in FIG. 4 were used, the lead frame having a die-pad Wa supported by four diagonally extending support bars Wb, the portion of the support bar Wb fabricated by press forming having a width of 0.300 millimeter. The lead frame was fabricated such that the portion thereof having a length b of 12.4 millimeters between the opposite lower bent portions Wd was press-formed to a depth of 0.240 millimeter.

Figure 5:
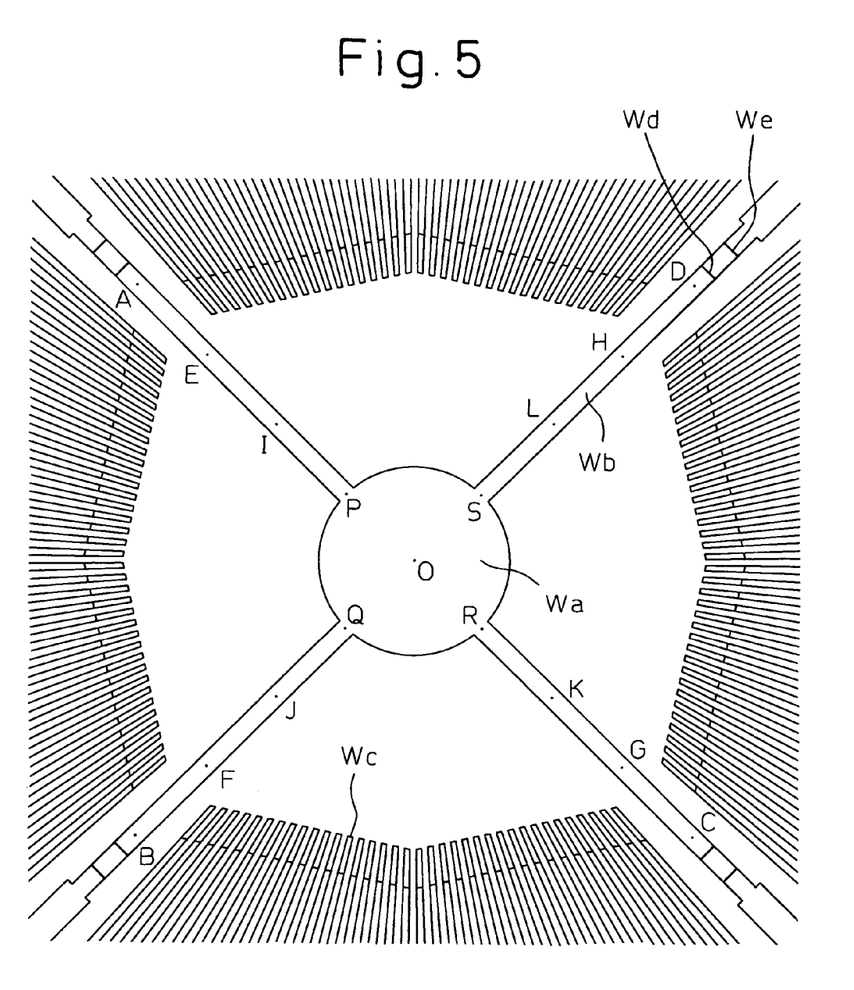
FIG. 5 is an illustration showing the points for the measurement of the displacement for a curved lead frame in the experiment on fabrication by press forming.

The measurement was carried out by allotting E, I, P, 0, R, K, and G to designate equally spaced points of the support bar Wb and the die-pad Wa between points A and C inside a pair of diagonally opposite bent portions Wd, as shown in FIG. 5, and measuring the amounts of upward displacement (displacement toward a punch used for the press forming) of points E, I, P, O, R, K, and G, on the basis of the level of points A and C. Also, the amounts of upward displacement of equally spaced points F, J, Q, O, S, L, H between points B and D inside another pair of diagonally opposite bent portions Wd were measured, on the basis of the level of points B and D.

Figure 7:
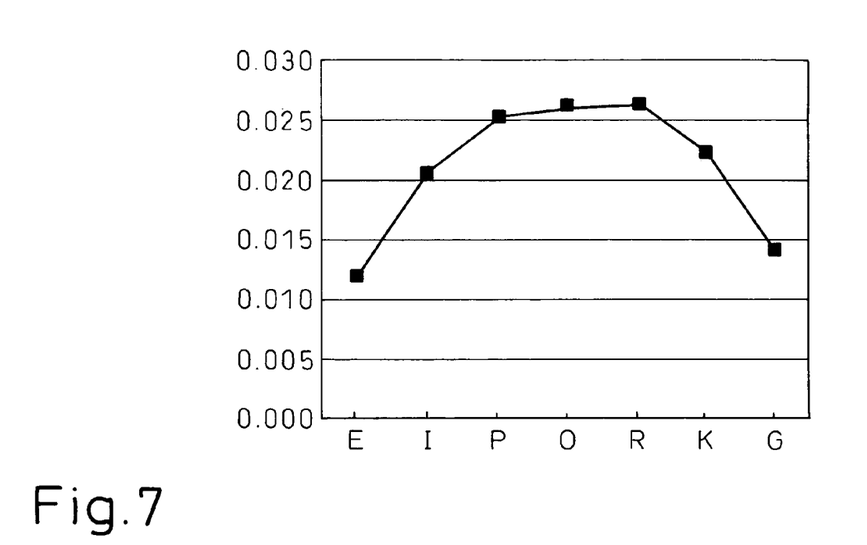
FIG. 7 is graphic representation of amounts of displacement measured for the curved lead frame fabricated by press forming using a conventional device.

FIG. 7 shows a graph of measured amounts of displacement of the respective points of the lead frame W fabricated by press forming using the conventional device Y. It is understood that in this lead frame, the amounts of displacement due to the curvature of the lead frame extend to 0.025 millimeter or larger in the vicinity of the center of the die-pad Wa.

Figure 6:
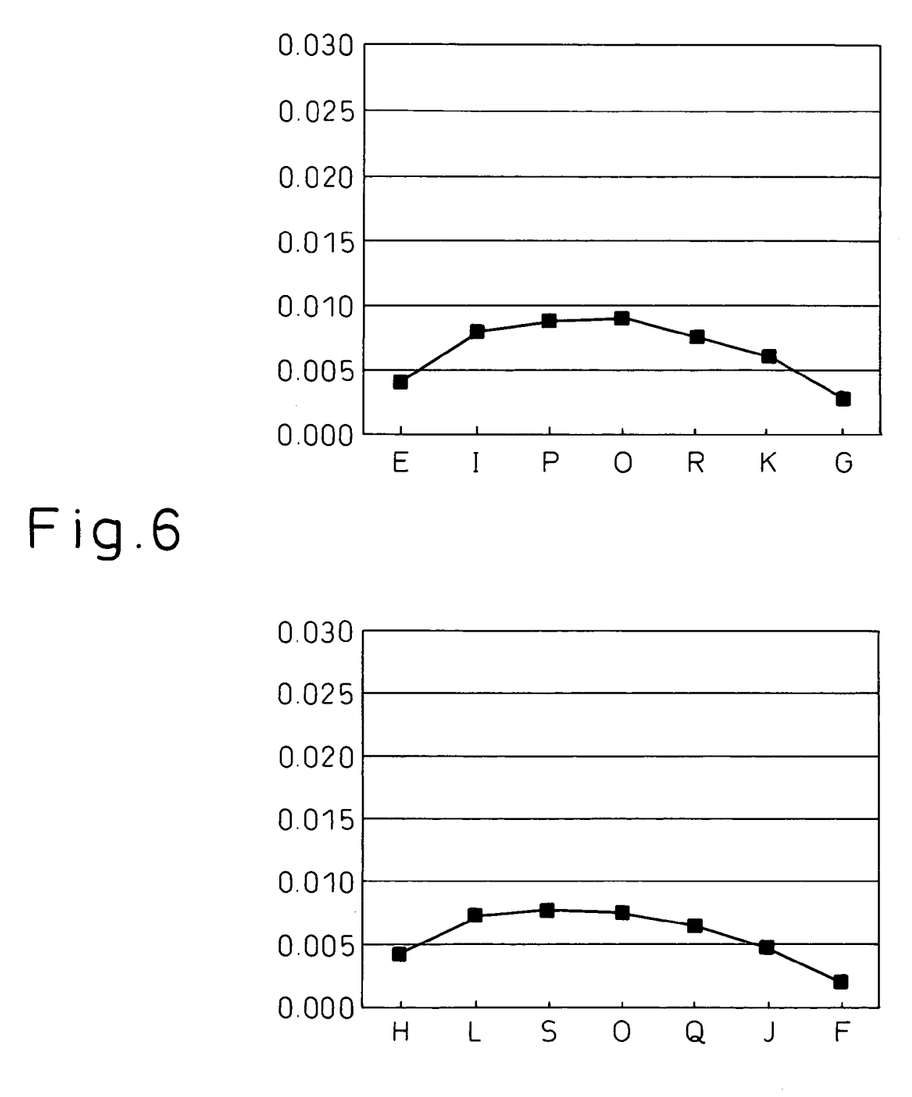
FIG. 6 is graphic representation of amounts of displacement measured for the curved lead frame fabricated by press forming using the device of the invention.

FIG. 6 shows a graph of measured amounts of displacement of the respective points of the lead frame W fabricated by press forming using the device X of the embodiment of the invention. In this case, the lead frame W can have controlled amounts of displacement due to the curvature up to of the order of 0.010 millimeter in the vicinity of the center of the die-pad Wa.

Thus, the lead frame fabricated by press forming using the device X according to the invention can adequately satisfy any standard even if the standard imposes a severe requirement of an amount of displacement of 0.015 millimeter or smaller.

Figure 11:
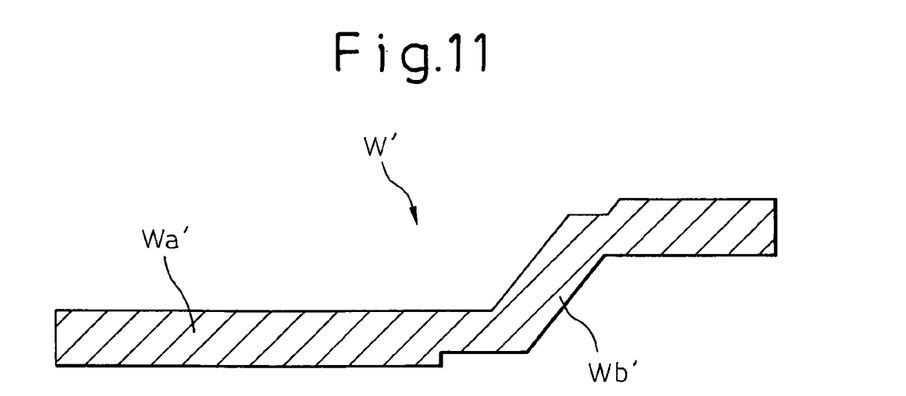
FIG. 11 illustrates a lead frame with bent cantilevered members of an embodiment of the invention.

By making the difference in pressure (displacement of material) between the inner and the outer sides of the bent portion of a lead frame small according to the invention, the distortion around the bent portion of the lead frame can be strained not only when a lead frame is fabricated by press forming at the opposite locations of the lead frame to have a concavity, but also when a lead frame having a free end is fabricated by press forming to provide a lead frame with bent cantilevered members, as illustrated in FIG. 11. The lead frame W' in FIG. 11 comprises a die pad Wa' having a free end and support bars Wb'.

When the invention is applied to the fabrication by press forming of a lead frame with outer leads, for example, curvature or distortion of the shape of the fabricated lead frame, such as warping of the ends of the outer leads, can be suppressed, and the lead frame has a difference in level of the leads falling within the requirements specified in a standard. When the invention is applied to the fabrication by press forming for the formation of flow controlling members for controlling the flow of a resin during the molding a lead frame with the resin, the distortion of the flow controlling members can be suppressed, and the flow controlling members can be formed to have a precise shape.

As described, according to the device and the method for fabricating a lead frame by press forming of the invention, the spring-back of a lead frame fabricated by press forming can be prevented, and the depth and the angle of the bending can be made even, resulting in the reduced variation in shapes of fabricated products (lead frames), while the curvature or distortion of the lead frame fabricated by press forming can be inhibited. The lead frame of the invention fabricated by press forming using the device or method according to the invention is free of spring-back, has even a depth and angle of bending, leading to the reduced variation in shapes of fabricated products, and has small curvature or distortion.

The invention claimed is:

1. A device for fabricating a lead frame by press forming, comprising:
   a die having a flat face, on which a lead frame to be fabricated by press forming is to be placed, and a first concavity, which is dented relative to the flat face, the die possessing a fabricating face extending from the bottom of the first concavity to the flat face through a slant, which is interposed between the bottom of the first concavity and the flat face, the fabricating face contributing to the fabrication of a lead frame by press forming; and
   a punch having punching faces formed so as to be opposite to the fabricating faces of the die for the fabrication of the lead frame by press forming;
   wherein at least one of the die and the punch are movable so as to hold the lead frame between the fabricating face of the die and the punching face of the punch for the fabrication of the lead frame by press forming; and
   wherein the bottom of the first concavity of the die has a second concavity, which is dented relative to the bottom, so as not to come into contact with the lead frame during the press forming thereof, and the punch has a front end opposite to the bottom of the first concavity of the die, the front end being formed so as to have a portion partially spreading over the second concavity.

2. The device of claim 1, wherein the lead frame to be fabricated by bending has a die-pad, on which a semiconductor chip is to be mounted, and support bars for supporting the die-pad, and wherein the first concavity of the die is formed such that the die-pad of the lead frame is located over the first concavity and the respective support bars of the lead frame straddle the first concavity when the lead frame is placed on the flat face of the die.

3. The device of claim 1, wherein the punch is movable relative to the die.

4. A method for fabricating a lead frame by press forming, comprising:
   fabricating the lead frame by press forming between a die and a punch;
   wherein the die has a flat face, on which the lead frame to be fabricated by press forming is to be placed, and a first concavity, which is dented relative to the flat face, the die possessing a fabricating face extending from the bottom of the first concavity to the flat face through a slant, which is interposed between .the bottom of the first concavity and the flat face, the fabricating face contributing to the fabrication of a lead frame by press forming;
   wherein the punch has punching faces formed so as to be opposite to the fabricating faces of the die for the fabrication of the lead frame by press forming;
   wherein at least one of the die and the punch are movable so as to hold the lead frame between the fabricating face of the die and the punching face of the punch for the fabrication of the lead frame by press forming; and
   wherein the bottom of the first concavity has a second concavity, which is dented relative to the bottom, so as not to come into contact with the lead frame during the press forming thereof, and the punch has a front end opposite to the bottom of the first concavity of the die, the front end being formed so as to have a portion partially spreading over the second concavity.

5. The method of claim 4, wherein a lead frame having a die-pad by press forming is fabricated and on which a semiconductor chip is to be mounted, and support bars for supporting the die-pad, and wherein the first concavity of the die is formed such that the die-pad of the lead frame is located over the first concavity and the respective support bars of the lead frame straddle the first concavity when the lead frame is placed on the flat face of the die.

6. The method of claim 4, wherein the punch is moved relative to the die.

* * * * *

UNITED STATES PATENT AND TRADEMARK OFFICE
CERTIFICATE OF CORRECTION

PATENT NO. : 7,134,311 B2  Page 1 of 1
APPLICATION NO. : 10/799601
DATED : November 14, 2006
INVENTOR(S) : Masahiro Iwabuchi It is certified that error appears in the above-identified patent and that said Letters Patent is hereby corrected as shown below:

In the Specification:

Col. 2, line 26, change "die pad" to --die-pad--

Col. 2, line 38, change "devicees" to --devices--

Col. 4, line 50, change "die pads" to --die-pads--

Col. 8, line 18, change "E, I, P, 0, R, K," to --E, I, P, O, R, K,--

Col. 8, line 58, change "die pad" to --die-pad--

In the Claims:

Col. 10, line 17, change "between .the" to --between the--

Signed and Sealed this

Twenty-seventh Day of March, 2007

JON W. DUDAS
*Director of the United States Patent and Trademark Office*